(12) United States Patent
Montagne

(10) Patent No.: US 9,041,478 B2
(45) Date of Patent: May 26, 2015

(54) ELECTRONIC OSCILLATION CIRCUIT

(71) Applicant: Anharmonic B.V., Rotterdam (NL)

(72) Inventor: Antonius Johannes Maria Montagne, Delft (NL)

(73) Assignee: ANHARMONIC B.V., Rotterdam (NL)

(*) Notice: Subject to any disclaimer, the term of this patent is extended or adjusted under 35 U.S.C. 154(b) by 0 days.

(21) Appl. No.: 14/355,081

(22) PCT Filed: Sep. 20, 2012

(86) PCT No.: PCT/NL2012/050666
§ 371 (c)(1),
(2) Date: Apr. 29, 2014

(87) PCT Pub. No.: WO2013/066161
PCT Pub. Date: May 10, 2013

(65) Prior Publication Data
US 2014/0285270 A1    Sep. 25, 2014

(30) Foreign Application Priority Data
Oct. 31, 2011 (NL) ...................................... 2007682

(51) Int. Cl.
*H03B 5/32* (2006.01)
*H03L 7/02* (2006.01)
*H03B 5/36* (2006.01)
*H03B 27/00* (2006.01)
*H03L 1/02* (2006.01)

(52) U.S. Cl.
CPC .. *H03L 7/02* (2013.01); *H03B 5/36* (2013.01); *H03B 27/00* (2013.01); *H03L 1/026* (2013.01)

(58) Field of Classification Search
CPC .......... H03B 27/00; H03B 5/36; H03L 1/026
USPC ........ 331/158, 116 R, 116 FE, 176, 2, 46, 47; 310/318; 374/117
See application file for complete search history.

(56) References Cited

U.S. PATENT DOCUMENTS

| | | | |
|---|---|---|---|
| 4,079,280 A * | 3/1978 | Kusters et al. ................ 310/318 |
| 4,227,158 A | 10/1980 | Schroeder et al. |
| 4,872,765 A * | 10/1989 | Schodowski ................ 374/117 |
| 5,214,668 A * | 5/1993 | Satou et al. .................. 374/117 |
| 5,525,936 A * | 6/1996 | Post et al. ....................... 331/47 |
| 6,420,938 B1 * | 7/2002 | Hoff et al. ...................... 331/176 |
| 6,545,550 B1 * | 4/2003 | Frerking ........................ 331/44 |
| 7,543,476 B2 * | 6/2009 | Ostanin ....................... 73/19.03 |
| 7,792,510 B2 * | 9/2010 | Pestryakov et al. .......... 455/260 |
| 2005/0184822 A1 | 8/2005 | Mattila et al. |

FOREIGN PATENT DOCUMENTS

WO  2005076480 A1  8/2005

* cited by examiner

*Primary Examiner* — Arnold Kinkead
(74) *Attorney, Agent, or Firm* — The Webb Law Firm

(57) ABSTRACT

An electronic oscillator circuit has a first oscillator, for supplying a first oscillation signal, a second oscillator, for supplying a second oscillation signal, a first controller for delivering the first control signal as a function of a phase difference between a first controller input and a second controller input of the first controller; a second controller for delivering the second control signal as a function of a phase difference between a first controller input of the second controller and a second controller input of the second controller; a resonator; at least a second resonance frequency, with a first phase shift dependent on the difference between the frequency of a second exciting signal and the second resonance frequency and processing means, for receiving the first oscillator signal and the second oscillator signal, determining their mutual proportion, looking up a frequency compensation factor in a prestored table and outputting a compensated oscillation signal.

13 Claims, 3 Drawing Sheets

ELECTRONIC OSCILLATION CIRCUIT

CROSS-REFERENCE TO RELATED APPLICATIONS

This application is the United States national phase of International Application No. PCT/NL2012/050666 filed Sep. 20, 2012, and claims priority to Netherlands Patent Application No. 2007682 filed Oct. 31, 2011, the disclosures of which are hereby incorporated in their entirety by reference.

BACKGROUND OF THE INVENTION

1. Field of the Invention

The present invention relates to an electronic oscillator circuit, and to a method for operating such a circuit. More in particular the invention relates to an electronic oscillator circuit with a reduced temperature sensitivity.

2. Description of Related Art

Electronic oscillator circuits generally comprise an element that causes an oscillation, or that can be brought in resonance, and then causes an oscillation. These oscillations can be used as a frequency or time reference in electronic circuits. The higher exactness that is required, the higher accuracy requirements are set to the oscillation circuit.

Since the accuracy of the oscillator circuit is highly dependent on the accuracy of the oscillator or resonator element, frequency and time references according to the art are built on material properties that are very well implicitly defined, such as for Caesium and Rubidium oscillators, which get their frequency accuracy from atomic energy levels. However, these elements are relatively expensive.

On a lower accuracy level quartz crystals are available as cheaper references. Quartz crystals are easy to use in an electronic circuit, and their purity is quite high when the quartz crystals are found in nature, resulting in good resonance characteristics. In production in a melt the purity can get close to perfection, making a number of undesirable effects (noise and aging related) close to non-existent. Driving a quartz crystal is simple as quartz shows piezoelectric behaviour, meaning that the accurate mechanical vibration properties of a crystal are easily driven and read by electronics.

An alternative for such lower accuracies is also available, stemming from the production of integrated circuits: Micro Electrical Mechanical Systems (MEMS) allow for components that can vibrate mechanically while being integrated with electronics.

Both quartz crystal and MEMS resonators show limitations in their stability, especially in their temperature behaviour, which has accuracies in the order of tens of parts per million (ppm) for a relevant temperature range from −40 to +125 degrees Celsius, which does not compare very favourably to the accuracies of Caesium and Rubidium oscillators (order a few parts per trillion, ppt) or so called particle fountains (order 0.001 ppt).

According to the art it is known to compensate the temperature behaviour of mainly crystal resonators. At manufacturing time the temperature deviation of resonators and oscillator circuits is established and stored as a compensation table, which is used to correct the deviation. A compensation method is known which uses a separate temperature measurement and tries to compensate the related crystal frequency deviation with extra capacitance. However, if the measurement device is glued to the crystal it introduces new temperature effects in the crystal, and if not there will be a temperature difference between the two elements which will make the dynamic response limited. In either case the accuracy suffers.

Aging is a complicating factor here, but it can remain limited with pre-aging, and working with pure materials in general. When using MEMS, purity is implicit in manufacturing and hermetic sealing can be achieved at limited cost.

By compensation of that temperature behaviour the crystal and MEMS resonators are moving towards the range of a few parts per billion (ppb).

It is a goal of the present invention to provide a electronic oscillator circuit and a method for operating such a circuit that lack the above disadvantages.

SUMMARY OF THE INVENTION

The invention thereto proposes an electronic oscillator circuit, comprising a first oscillator, for supplying a first oscillation signal with a first oscillation frequency dependent on a first control signal, at least a second oscillator, for supplying a second oscillation signal with a second oscillation frequency dependent on a second control signal, a first controller for delivering the first control signal as a function of a phase difference between a first controller input and a second controller input of the first controller, a second controller for delivering the second control signal as a function of a phase difference between a first controller input of the second controller and a second controller input of the second controller, and a resonator, with at least a first resonance frequency, with a first phase shift dependent on the difference between the frequency of a first exciting signal and the first resonance frequency, at least a second resonance frequency, with a first phase shift dependent on the difference between the frequency of a second exciting signal and the second resonance frequency, wherein the first oscillation signal is fed back to the first controller input of the first controller, and to the second controller input of the first controller via the resonator; and the second oscillation signal is fed back to the first controller input of the second controller, and to the second controller input of the second controller via the resonator, a processor, for receiving the first oscillator signal and the second oscillator signal, determining their mutual proportion, looking up a frequency compensation factor in a prestored table and outputting a compensated oscillation signal.

Resonators with a first resonance frequency and at least a second resonance frequency are called "multi-mode" resonators. When the resonance frequencies (or modes) can take place simultaneously, the resonators are referred to as continuous dual mode resonator. In such an approach the two resonances can be measured together at the same temperature of the resonator.

Temperature effects of different oscillation modes of a crystal resonator do not match. As a result, the mutual proportion of the simultaneous modes changes. According to the present invention, this effect is used to determine the temperature of the resonator, and once the temperature is determined, to compensate for a deviation that is known to occur at said temperature. The compensation takes place by a processor that uses a prestored compensation table, that provides a compensation factor for a measured mutual proportion. In the present case, the changing mutual proportion is assumed to be caused by a temperature change, but other external influences like external pressure may be thinkable.

One of the advantages of this method is that it renders the use of a separate temperature sensor superfluous. This solves the disadvantage of the circuits according to the art, that are difficult to integrate in a chip due to elements required such as temperature sensor next or close to the resonator, a varicap on or close to the resonator, or frequency selective elements (filters).

The use of dual mode has a limitation: as the resonator has many modes there will be modes that will have identical resonance frequency at a certain temperature. This effect may be tiny, for instance in some case where a 3rd overtone is interfered by one of the other 3rd overtones, but it can be significant enough to limit the accuracy of the solution. The frequencies where this happens are named activity dips, which is a bit of a misnomer as actually there is extra activity. In order to overcome this limitation, a third mode may be applied.

Since the invention is based on determination of a frequency ratio, its performance is related to the ability to determine exact frequencies. In general, non-linear functions in electronic circuits make it difficult to accurately and robustly measure a mixture of frequencies. For this and other reasons, such as noise reduction, it is desired to separate the oscillation frequencies and to avoid the mixture of oscillation signals definitely as much as possible.

According to the art, the separation of frequencies is done with filter means, typically something like a second or higher order LC filter, with the resonant frequency on the selected oscillation mode. For real resonators this resonance frequency will be relatively low, which in turn implies bulky, non-integrated components, temperature coefficients for the filter, aging issues and such. All in all such solutions are very difficult to design with a high degree of robustness.

According to the present invention, this problem is solved by applying a down conversion oscillator. In the down conversion process the desired signal is mapped to another frequency, for instance a low IF or even DC, which maps other signals to different frequencies, thus creating a good separation. The down converter can be combined with a low pass filter or a second low speed IF to DC filter to give a large selectivity for a single signal.

BRIEF DESCRIPTION OF THE DRAWINGS

The invention will now be elucidated into more detail with reference to the following figures, wherein.

DESCRIPTION OF THE INVENTION

Figure 1:
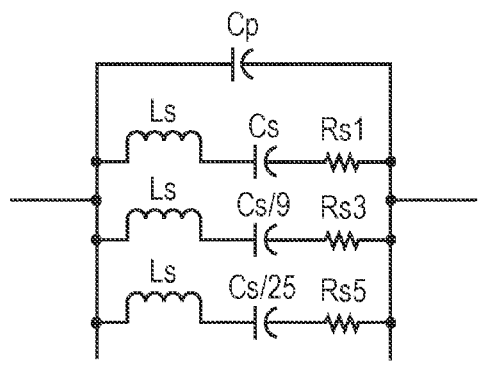
FIG. 1 shows a model of a resonator according to the art.

FIG. 1 shows a model of a resonator according to the art. The model comprises components for a single basetone, a single third overtone, single fifth overtone, and the parallel capacitance is present. This capacitance can be made part of the oscillation (parallel resonance) or not (series resonance). The overtones are harmonic overtones, which makes the model unsuitable for the present invention. In practice, the value of the capacity in series with $Rs1 \approx Cs/3$, the value of the capacity in series with $Rs3 \approx Cs/9$, etc.

Figure 2:
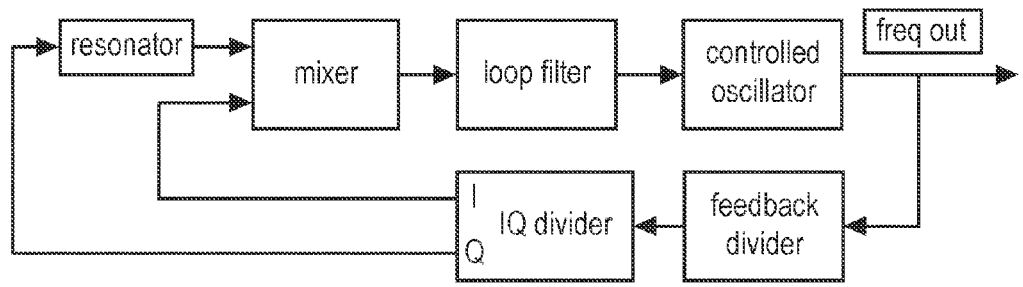
FIG. 2 shows an implementation of a single mode oscillation circuit without temperature compensation.

FIG. 2 shows a block diagram of a single mode oscillation circuit without temperature compensation, according to a patent application by the same applicant. In the figure, an example of a down conversion oscillator is shown. The basis is that the resonator shows a frequency dependent phase shift such that the feedback system searches for the correct phase alignment, at which the resonance has been 'found'. The mixer requires for the steady state solution that the signals on its inputs are 90 degrees phase shifted, but for common resonators, the phase shift of the resonator at resonance is 0 degrees. An I/Q divider is used to obtain the extra 90 degrees phase shift.

Figure 3:
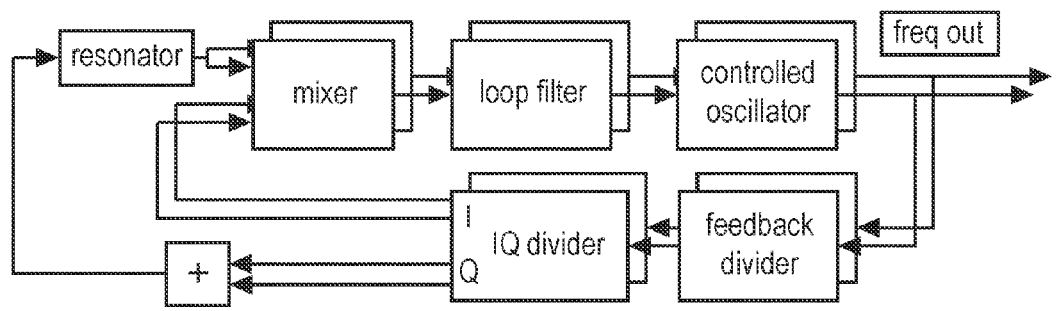
FIG. 3 shows a first embodiment of an oscillation circuit according to the invention.

FIG. 3 shows a block diagram of first embodiment of a multi mode oscillation circuit according to the invention. With respect to the circuit from FIG. 2, almost all circuits in this block diagram are doubled so that mutual isolation is provided from the other oscillations. In the case shown, "multi" is to be interpreted as "dual", but according to the present invention, more modes are thinkable, and in that case, more parallel blocks are present.

The down conversion requires a signal that runs on the selected resonance frequency, which will be generated anyhow as we also need to supply the resonance signal as energy source into the resonator. But for both the signal giving function as the down conversion the frequency actually generated may be much higher; a simple divider will be able to get the signals on the correct resonance frequency. A divider may be used for the division by 4 (quadrature takes some signal and a 90 degrees shifted signal, so ¼ of the targeted frequency.) A high frequency oscillator can be used of which the output signal is divided down to match the selected resonance frequency. This possibility increases the ease of integration of the whole solution.

As shown in the block diagram the resonator is connected on the signal input side with a relatively simple addition (superposition) point. For instance by choosing currents as the carrier of information the addition becomes a matter of simple connection.

The use of mixers is very attractive, but in the shown configuration there are nevertheless still issues related to detail choices. For instance, for noise considerations it is attractive to use a switching mixer; linear mixers have transistors that are on all the time, and noise will increase because of this. But switched mixers show poorer rejection of higher harmonics than linear ones (if the linear one is fed with a sine like signal) and this comes into the system as performance limitation in the form of especially phase noise on an output, and/or as jitter that disturbs the frequency measurement, forcing a relatively long measurement period.

Figure 4:
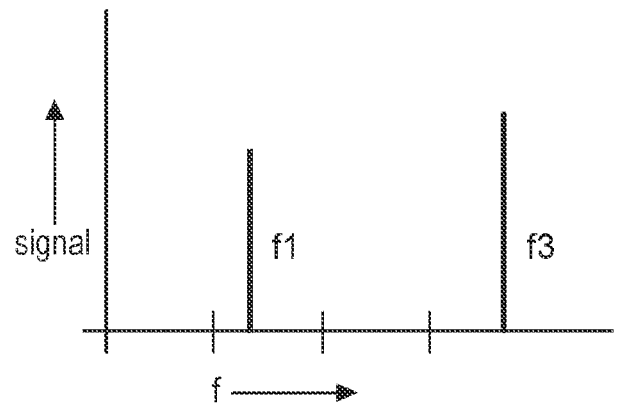
FIG. 4 shows a spectrum of an oscillation circuit according to the invention.

FIG. 4 shows a spectrum of an oscillation circuit according to the invention. In above figure two modes are active; a base tone and a so called third overtone with a frequency that is about three times that of the fundamental. Implicit understanding may be that the oscillations are perfectly sinusoidal, which is actually quite plausible: the quality at the resonance frequencies will be so high that anything else will be filtered out.

Figure 5:
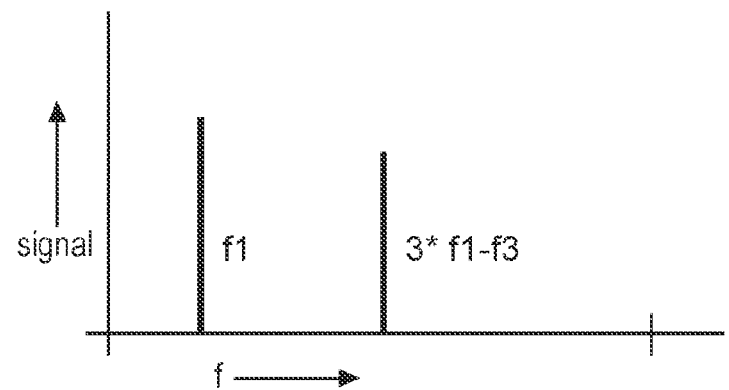
FIG. 5 shows a spectrum of an oscillation circuit according to the invention with harmonic mixing.

FIG. 5 shows a spectrum of an oscillation circuit according to the invention with harmonic mixing. In case best phase noise on the f1 oscillation is desired, we need to have a look on what happens after the f1 mixer. In the example given, this is a switching mixer, with a block signal on one side: f1 is at single strength, but 3*f1 is still at ⅓ of the normal strength (this corresponds to a Fourier series of a block signal). But the mixer will also mix the input f3 with the 3*f1 signal (at ⅓ strength) which maps in frequencies into the beat frequency (so the quantity that the an-harmonic is 'off-grid').

In the resulting spectrum as shown in above figure the 3*f1−f3 is now the smaller spectral component, as a result of the 3 times weaker drive into the mixer. But still, it is significant, and depending on the an-harmonic distance it may be difficult to suppress in the feedback loop or in the frequency measurement.

According to the invention, there are multiple solutions to improve this behaviour:

Changing the mixer from switching mixer to linear mixer. The way to do this is to shape the I signal from the IQ divider to look more like a sine. A good first step would be to make it triangular as the Fourier series of a triangle is really more optimal ($3^{rd}$ overtone ⅑ of the base). Of course, taking the triangle and use sine-shaping would make the performance even higher.

Reducing the energy of the third an-harmonic in the resonator by driving the resonator on a lower level. This reduction is straight, but in reality probably not attractive as probably the highest harmonic will be the base for generation of the output frequency.

Using a notch filter on the an-harmonic. The f1 feedback loop uses a filter, and that filter can be extended to reduce propagation of the beat components. The filter can for instance conveniently be built as a switched cap filter.

Driving the measurement of the output frequency on f1 such that the beating is not disturbing the measurement. The most convenient way is to figure out the current beat, adjust the measurement period to a relatively precise multiple of the beat period and measure again.

Figure 6:
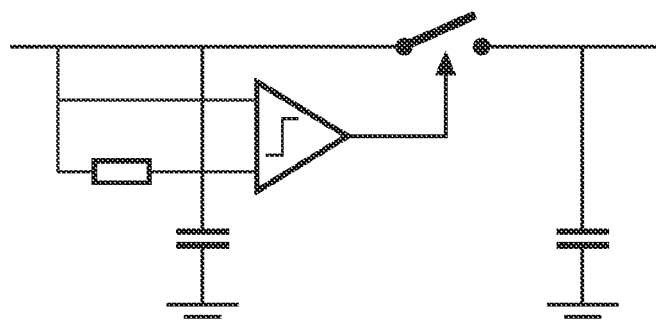
FIG. 6 shows resampling under control of a comparator function.

Controlling the frequency measurements such that its accuracy is not degraded a lot by the suppression of the spurious is thus quite simple, but the larger difficulty is the suppression of spurious on the output of the controlled oscillators altogether, as that must be done in the analog realm. For a dual mode oscillator a resampling filter at the beat rate would be convenient: it would reject the disturbance completely. However, the beat frequency may be quite low, thus limiting the maximum effective loop bandwidth, which may hurt noise considerations of the overall loop, and it is limited to dual mode only. To this end the circuit in FIG. 6 can show good services:

FIG. 6 shows how the resampling happens under control of a comparator function, one input of which is the raw signal after the mixer with spurious, and the second input is the same but low frequency filtered: on zero crossings the comparator will enable the signal path, the excursions around the zero crossings, representative of the spurious, will not be sampled and passed on. The big advantage of this circuit is that requires zero crossings to be present only, which actually will happen at a minimum rate of the lowest mode used in the oscillator, maybe more often. That the sampling is somewhat unpredictable is harmless, as the sampling is only rejecting spurious but does not influence the further transfer of this circuit with corner frequencies and such. Thus the bandwidth through this circuit is hardly limited.

A further advantage of mixing is that the mixing at f3 loop is much cleaner: there the signal from the resonator is still quite clean and the I signal from the IQ divider does not contain ⅓f3, but 3f3, 5f3 etc. So the mixing at this loop is clean from this perspective. However, then we hit the next level of disturbance: the resonator probably carries a parallel capacitance, and that capacitance is driven with f1, probably in the form of a relatively rectangular signal. The driving signal will be small as the resonator will show resonance rise, which will make the resonator signal appear big compared to the driving signal, but it will be present. If the driving signal is rectangular its third overtone will be ⅓ of the base tone, so that factor 3 will compound with the resonance rise factor, and still give output disturbance.

To give an impression of required sizing: the $5^{th}$ overtone of a 20 MHz crystal will oscillate with 10 ns period. But telecomm standards require phase noise as low as for instance 0.1 ps RMS between 12 kHz and 80 MHz, and only part of the budget may be allocated to the oscillator. Since there is a focuses on structural effects (tones), a 10% budget is acceptable so about 10 fs. This would be RMS, so we have at least 3 dB from the sqrt(2), but we need a factor 1 million (10 ns/10 fs), so 120 dB. So if we have 3 dB from the RMS, 9 dB from the third overtone part in a rectangular signal and maybe 50 dB from the resonance rise, we still need a small 60 dB.

Figure 7:
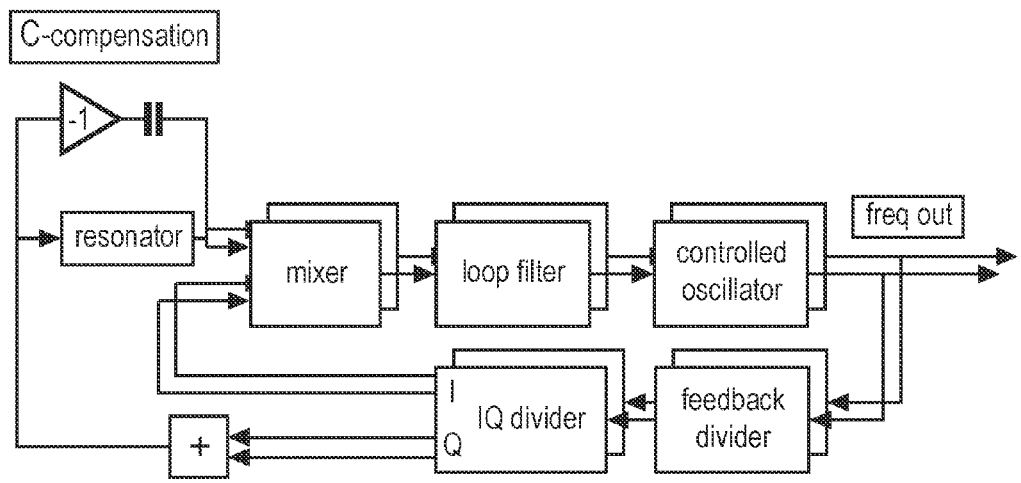
FIG. 7 shows an oscillation circuit according to the invention, with a compensation circuit.

FIG. 7 shows an oscillation circuit according to the invention, with a compensation circuit. Here, the presence of the parallel capacitance itself is compensated. The necessary size of the C compensation can be done with an image rejection mixer, and a small control loop where the C compensation is implemented as a varicap, and its control voltage is calculated by looking at the amplitude as it can be established with a mixer.

Figure 8:
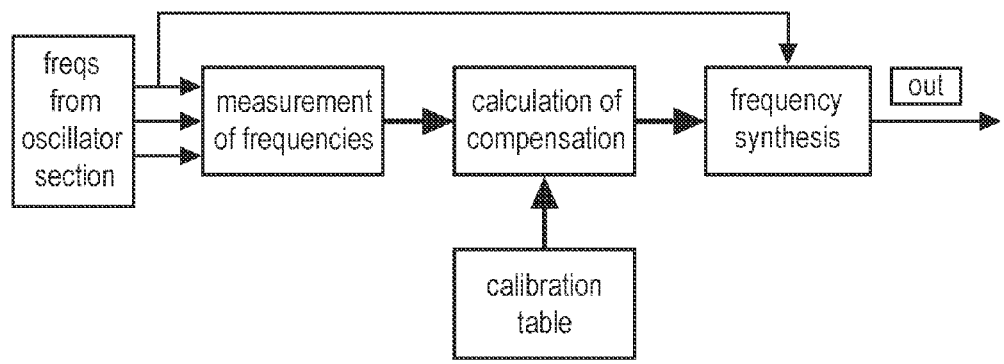
FIG. 8 shows a processor for outputting a compensated signal.

FIG. 8 shows a processor for outputting a compensated signal. Here, the an-harmonic signals are taken and used for generating a stabilized frequency. The frequencies are measured, a calibration table is used to determine what the correction should be by some interpolation/line matching maths and the correction is sent to the output frequency synthesis.

This is relatively trivial and has been applied many times for older dual mode oscillators. It does take a calibration step, which is done in large batches of resonators that are temperature cycled while monitoring the difference between a stable reference signal and the multi-mode frequencies.

At the calibration phase an extra large advantage of the new multi mode oscillators becomes apparent: the resonators may (will) have activity dips, that actually limit the achievable accuracy: at those dips one of the multi mode frequencies will have a problem as actually the resonator actually supports also another mode at that activity dip, and the frequency behaviour becomes a bit erroneous. There are two ways to eleminate this with the new multi mode oscillator:

Using at least a triple mode oscillator and note during calibration which frequency cannot be trusted. At those frequencies the compensation algorithm should not use the mode that relates to that frequency, but only the other two.

Using at least a quadruple mode oscillator and note while running that a frequency does not match the calibration points at slightly different temperatures. This match can be found with simple polynomial interpolation and seeing that a few points have an error beyond the desired performance level. Those points can be dropped.

Actually the first method is making use of 4 frequencies, just like the second one, with the extra understanding that the $4^{th}$ frequency is actually formed by the stable reference at calibration, so that the 'quirky one' can be duly noted during calibration. Both methods have lines to information theory, where a Hamming distance 2 is necessary for error detection and correction. The method according to the invention only requires least two 'good' frequencies for high accuracy correction, and there is a surplus of two to do error detection and correction.

A further aspect from the method is that it enables good rejection between the modes and that that brings speed to the solution. For instance, if all modes would carry a lot of jitter from the other modes, the needed high accuracy of the frequency acquisition for the compensation will take time to average out jitter. And that directly limits the highest speed at which the compensation can be performed, thus limiting the speed with which temperature drifts are followed.

The examples given above are exemplary only, and do not limit the scope of protection of the invention, as determined by the following claims.

The invention claimed is:

1. An electronic oscillator circuit, comprising:
   a first oscillator, for supplying a first oscillation signal with a first oscillation frequency dependent on a first control signal;
   at least a second oscillator, for supplying a second oscillation signal with a second oscillation frequency dependent on a second control signal;
   a first controller for delivering the first control signal as a function of a phase difference between a first controller input and a second controller input of the first controller;
   a second controller for delivering the second control signal as a function of a phase difference between a first controller input of the second controller and a second controller input of the second controller;
   a resonator, with
      at least a first resonance frequency, with a first phase shift dependent on the difference between the frequency of a first exciting signal and the first resonance frequency;
      at least a second resonance frequency, with a first phase shift dependent on the difference between the frequency of a second exciting signal and the second resonance frequency;
   wherein
      the first oscillation signal is fed back to the first controller input of the first controller, and to the second controller input of the first controller via the resonator; and
      the second oscillation signal is fed back to the first controller input of the second controller, and to the second controller input of the second controller via the resonator; and
   a processor, for receiving at least the first oscillator signal and the second oscillator signal, determining their mutual proportion looking up a frequency compensation factor in a prestored table outputting a compensated oscillation signal.

2. The circuit according to claim 1, wherein the first and at least second oscillation frequencies are filtered and fed back through at least partially separated feed back channels.

3. The circuit according to claim 1, wherein at least one of the controllers comprises a down converter.

4. The circuit according to claim 1, wherein at least one of the controllers comprises a mixer, in particular a linear mixer.

5. The circuit according to claim 1, wherein a feedback channel comprises a divider, in particular an IQ divider.

6. The circuit according to claim 5, comprising a waveshaping circuit, for at least shaping an output of a the divider to a sine or a triangular waveform.

7. The circuit according to claim 1, comprising a filter for reducing a level of the feed through of the harmonics in the control signals.

8. The circuit according to claim 7, wherein the filter is a notch filter such as switched cap filter.

9. The circuit according to claim 3, comprising means for resampling the signal between the down converter and at least one of said oscillators, for suppression of spurious emission on the output of the controlled oscillators.

10. The circuit according to claim 1, wherein the processor comprises a temperature calibration table.

11. The circuit according to claim 1, wherein the resonator comprises at least a third resonance frequency, and the circuit further comprises at least a third controllable oscillator.

12. The circuit according to claim 11, wherein the resonator comprises at least a fourth resonance frequency, and the circuit further comprises at least a fourth controllable oscillator.

13. A method for generating an oscillation signal, comprising:
   supplying a first oscillation signal with a first oscillation frequency dependent on a first control signal;
   supplying a second oscillation signal with a second oscillation frequency dependent on a second control signal;
   delivering the first control signal as a function of a phase difference between a first controller input and a second controller input of the first controller;
   delivering the second control signal as a function of a phase difference between a first controller input of the second controller and a second controller input of the second controller;
   supplying a resonator, with
      at least a first resonance frequency, with a first phase shift dependent on the difference or ratio between the frequency of a first exciting signal and the first resonance frequency;
      at least a second resonance frequency, with a first phase shift dependent on the difference between the frequency of a second exciting signal and the second resonance frequency;
   wherein
   feeding the first oscillation signal back to the first controller input of the first controller, and to the second controller input of the first controller via the resonator; and
   feeding the second oscillation signal back to the first controller input of the second controller, and to the second controller input of the second controller via the resonator;
   receiving the first oscillator signal and the second oscillator signal,
   determining their mutual proportion
   looking up a frequency compensation factor in a prestored table
   outputting a compensated oscillation signal.

* * * * *